United States Patent

Lu et al.

[11] Patent Number: 6,066,572
[45] Date of Patent: May 23, 2000

[54] METHOD OF REMOVING CARBON CONTAMINATION ON SEMICONDUCTOR SUBSTRATE

[75] Inventors: Le-Yen Lu, Taipei Hsien; Yau-Kae Sheu, Hsinchu, both of Taiwan

[73] Assignee: United Semiconductor Corp., Hsinchu, Taiwan

[21] Appl. No.: 09/241,338

[22] Filed: Feb. 1, 1999

[30] Foreign Application Priority Data

Nov. 6, 1998 [TW] Taiwan ................................ 87118501

[51] Int. Cl.$^7$ ..................................................... H01L 21/02
[52] U.S. Cl. .......................... 438/774; 438/774; 438/906; 438/974
[58] Field of Search ...................... 438/585, 774, 438/906, 974

[56] References Cited

U.S. PATENT DOCUMENTS 5,902,412  5/1999  Taylor .

OTHER PUBLICATIONS

Sorab K. Ghandhi, "VLSI Fabrication Principles", John Wiley & Sons, p. 518, Jan. 6, 1983.

*Primary Examiner*—George Fourson
*Assistant Examiner*—Joannie A. Garcia

[57] ABSTRACT

A method of removing carbon contamination. On a semiconductor substrate having carbon contamination thereon, a sacrificial oxide layer is formed. During the formation of the sacrificial oxide layer, an agent is introduced to help and improve the growth of the sacrificial oxide layer, and to trap the carbon contamination. The sacrificial oxide layer is then removed, and the carbon contamination is removed with the sacrificial oxide layer.

16 Claims, 5 Drawing Sheets

METHOD OF REMOVING CARBON CONTAMINATION ON SEMICONDUCTOR SUBSTRATE

CROSS-REFERENCE TO RELATED APPLICATION

This application claims the priority benefit of Taiwan application serial no. 87118501, filed Nov. 6, 1998.

BACKGROUND OF THE INVENTION

1. Field of the Invention

The invention relates in general to a method ore removing carbon contamination on a semiconductor substrate, and more particular, to a method of removing carbon contamination by forming a sacrificial oxide layer.

2. Description of the Related Art

An etching process is to remove a part of a thin film with a thickness from hundreds to thousands angstrom by chemical reaction or physical method. A photolithography process is performed first to transfer a pattern on a photo-mask to the thin film. The etching process is then performed to define the thin film.

Two kinds of etching processes, including a wet etching and a dry etching, have been widely applied in semiconductor fabrication technique. The wet etching process is basically an isotropic etching process, so that an undercut is often caused under a photo-resist layer. The undercut may cause problems in electrical properties in a device formed subsequently. A very precise pattern can typically be obtained by dry etching since the dry etching process is a kind of anisotropic etching process.

However, though a more precise patterned may be transferred by dry etching, the carbon containing etching plasma such as a gas mixture of carbon fluoride ($CF_4$), carbon tri-flouride ($CF_3$), and argon may easily contaminate an exposed semiconductor substrate or silicon layer with carbon. That is, the silicon atoms of the exposed semiconductor substrate or silicon layer may combine and bond with the carbon atoms. As a consequence, the thickness and the quality of an oxide layer formed subsequently is difficult to control.

In FIG. 1, a flowchart showing a conventional method of removing carbon contamination on a semiconductor substrate is presented. When a large quantity of carbon contamination is left on a semiconductor substrate, hydrogen fluoride is commonly used as an etchant to remove the carbon contamination. However, the effect of removal by this method is not good. A residue of carbon contamination is typically left on the semiconductor substrate even after the etch process with diluted hydrogen fluoride as an etchant. Further, if the etch is performed for a long time in order to remove the carbon contamination completely, the devices or other structures formed on the semiconductor substrate are likely to be damaged by the corrosive hydrogen fluoride. Thus, the hydrogen fluoride etch is typically limited and carbon contamination remains.

To resolve the problem of the method shown in FIG. 1, another prior technique was developed. FIG. 2 shows a flow chart of another conventional method of removing carbon contamination on a semiconductor substrate. When a large quantity of carbon contamination is left on a semiconductor substrate, a sacrificial oxide layer with a thickness of about 100 Å is formed on the substrate using thermal oxidation. The sacrificial oxide layer is then stripped. The function of the sacrificial oxide layer is to trap carbon contamination. Thus, when the sacrificial oxide layer is stripped, the trapped carbon is removed. However, as mentioned above, carbon contamination inhibits the growth of oxide, and therefore, the effect of trapping carbon contamination in the oxide layer is limited. Further, stripping the sacrificial oxide layer, a residue of carbon contamination still remains. Moreover, it takes a long time to grow a thick oxide layer on a carbon contamination wafer, and that slows down production.

A detailed description of the method shown in FIG. 2 is explained as follows with accompanying drawings FIG. 3A to FIG. 3D. In FIG. 3A, a semiconductor substrate 300 is provided. On the semiconductor substrate 300, a large quantity of carbon contamination 302 is left by previous processes. In FIG. 3B, a sacrificial oxide layer 304 is formed by thermal oxidation. Due to the large quantity of carbon contamination 302 which inhibits the growth of oxide, the sacrificial oxide layer is very thin, for example, as thin as 100 Å. In FIG. 3C, using diluted hydrogen fluoride as an etchant, the sacrificial oxide layer 304 is removed. Since a part of the carbon contamination 302 is trapped by the sacrificial oxide layer 304, this part of carbon contamination is removed with the sacrificial oxide layer 304. However, as shown in the figure, the sacrificial oxide layer 304 does not trap all the carbon contamination 302, so a residue of contamination 302a still remains on the substrate. In FIG. 3D, a gate oxide layer 306 is formed on the substrate 300 containing the carbon contamination residue 302a.

A residue of carbon contamination on a semiconductor substrate appears inevitable when using the above two methods. Thus, to remove the carbon contamination completely, hydrogen fluoride can be used as an etchant to perform an etch process for a long time, but then the devices or other structures are easily damaged due to corrosion from the hydrogen fluoride etchant. There is thus a need for a way to remove the carbon contamination, preferably quickly, while not damaging the other devices and structures on the substrate.

SUMMARY OF THE INVENTION

It is an object of the invention to provide a method of removing carbon contamination by forming a sacrificial oxide layer with the introduction of an agent for improving oxide growth. The carbon contamination is effectively removed from the surface of the semiconductor substrate when the thus-formed sacrificial oxide layer is removed. Thus, the thickness of the gate oxide layer formed subsequently can be controlled as required, the quality of the gate oxide is improved, an an enhanced yield of device is obtained.

To achieve these objects and advantages, and in accordance with the purpose of the invention, as embodied and broadly described herein, the invention is directed towards a method of removing carbon contamination on a semiconductor substrate. On a semiconductor substrate having a quantity of carbon contamination left thereon, a sacrificial oxide layer is formed. During the formation of the sacrificial oxide layer, an agent such as trans-dichloroethylene or other organic compound having similar chemical characteristic as trans-dichloroethylene is introduced. With the introduction, the growth of the sacrificial oxide layer is improved and most of the carbon contamination is trapped by the sacrificial oxide layer. By removing the sacrificial oxide layer, the carbon contamination is removed. The oxide layer also grows faster than the prior art, so that overall process is quicker, as well as more efficient. It is believed possible, but not known for certain, that similar advantages will arise by applying the agent immediately before, but not necessarily during the formation of the oxide layer.

Both the foregoing general description and the following detailed description are exemplary and explanatory only and are not restrictive of the invention, as claimed.

DETAILED DESCRIPTION

Figure 4:
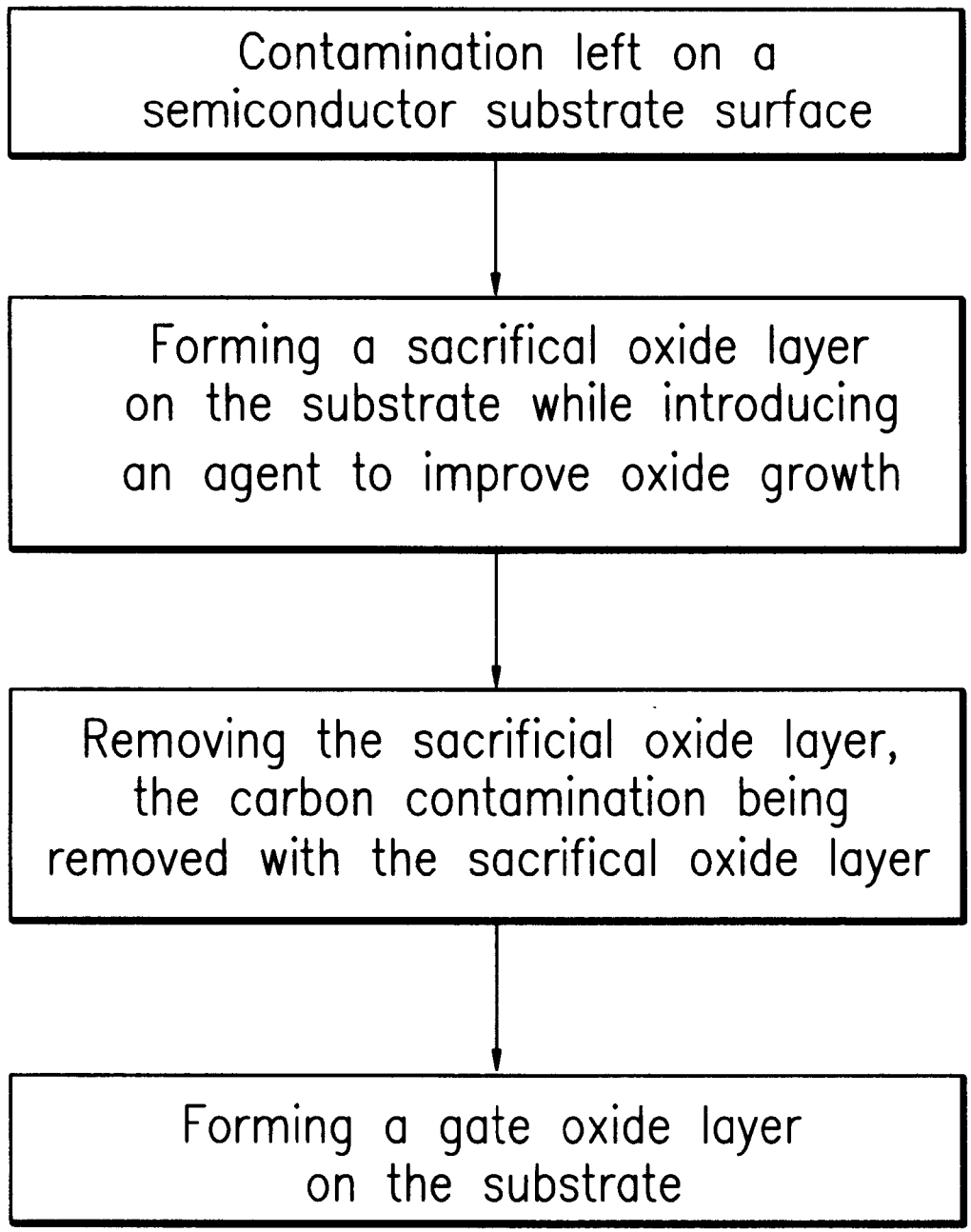
FIG. 4 shows a flow chart of a method of removing carbon contamination on a semiconductor substrate according to the invention.

In FIG. 4, a flow chart of a method of removing carbon contamination is shown. On a semiconductor substrate having carbon contamination thereon, under a high temperature environment, a sacrificial oxide layer is formed with an introduction of an agent such as trans-dichloroethylene or other chemical compound having chemical properties such as polarity, atomic structure, or component similar to trans-dichloroethylene. With the introduction of the agent, the growth of the sacrificial oxide is improved. More sacrificial oxide can be grown in a shorter time compared to the conventional method. That is, the sacrificial oxide layer is formed with a larger coverage area, a larger thickness, and a faster speed. It is believed that the growth is sufficiently uniform and sufficiently thick that substantially all of the carbon contamination is trapped by the sacrificial oxide. Using hydrogen fluoride as an etchant, the sacrificial oxide layer is then removed. Since all of the carbon contamination is trapped by the sacrificial oxide, while removing the sacrificial oxide, the carbon contamination is removed efficiently. The hydrogen fluoride etching need not continue after removal of the oxide layer—as sometimes occurs in the prior art in attempt to remove more carbon contamination.

A detailed description of the method shown in FIG. 4 is presented as follows with the accompanying drawings FIG. 5A to FIG. 5D.

Figure 5A:
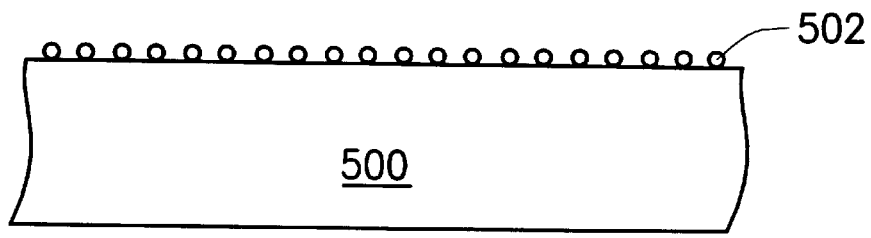
FIG. 5A to FIG. 5D are cross sectional views of the method of removing carbon contamination of FIG. 4.
Figure 5B:
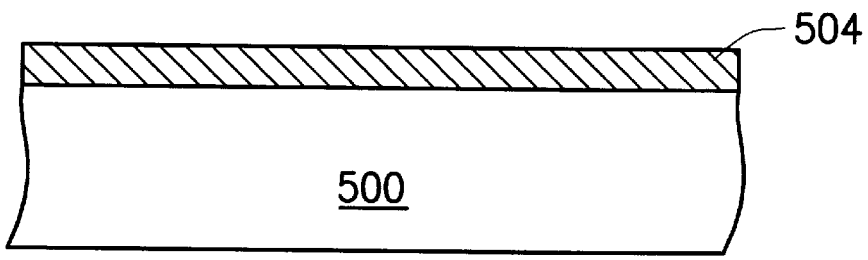

In FIG. 5A, a semiconductor substrate 500 is provided. On an exposed surface of the semiconductor substrate 50, a large quantity of carbon contamination 502 is left by previous processes. In FIG. 5B, a sacrificial oxide layer 504 is formed by typical process, for example, by thermal oxidation. As mentioned above, in the conventional method, due to the large quantity of carbon contamination which inhibits the growth of oxide, the sacrificial oxide layer is very thin, for example, as thin as about 100 Å. Thus the carbon contamination cannot be trapped by the sacrificial oxide effectively. In the invention, while forming the sacrificial oxide layer 504, an agent which includes trans-dichloroethylene or other chemical compound having chemical properties similar to trans-dichloroethylene to improve the growth of oxide on a carbon contaminated semiconductor surface is introduced. In this example, the sacrificial oxide layer is formed by introducing oxygen and trans-dichloroethylene as an agent to help and improve the growth of the sacrificial oxide layer 504. The growth of the oxide layer 504 and the application of the agent advantageously occur for a sufficient time and for a sufficient portion of the oxide formation, that a substantial portion of the carbon contamination 502 is trapped by the sacrificial oxide layer. Preferably, the agent application and the accompanying oxide growth occur until substantially all of the carbon contamination 502 is trapped by the oxide layer. As a consequence of the enchanced growth with the agent, the sacrificial oxide layer 504 can be formed thicker than the sacrificial oxide layer 304 formed by the conventional method. The thicker oxide layer 504 helps remove more carbon contamination.

Figure 5C:
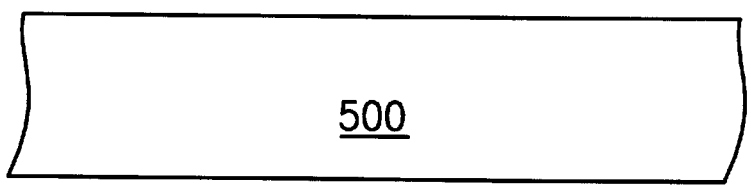

FIG. 5C, using diluted hydrogen fluoride as an etchant, the sacrificial oxide layer 504 is removed. Since most of the carbon contamination 502 is trapped by the sacrificial oxide layer 504, the carbon contamination 502 is removed with the sacrificial oxide layer 504.

Figure 1:
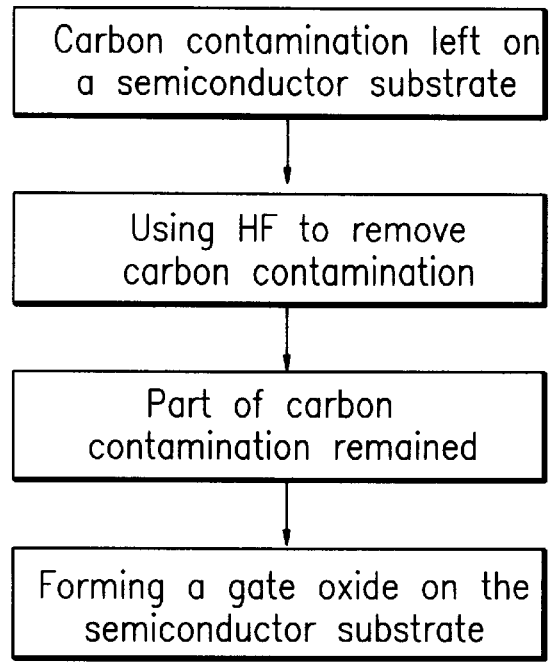
FIG. 1 shows a flow chart of a conventional method of removing carbon contamination on a semiconductor substrate.
Figure 2:
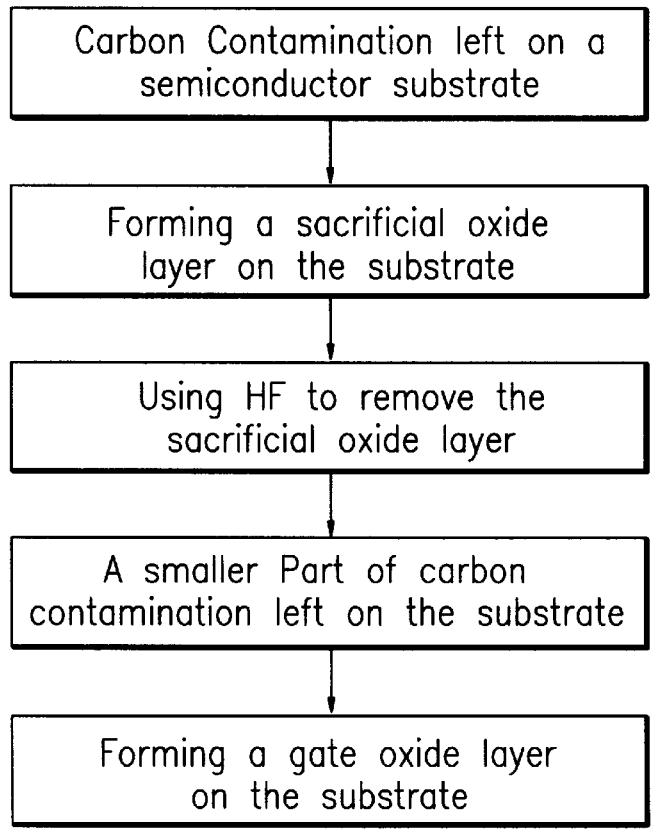
FIG. 2 shows a flow chart of another conventional method of removing carbon contamination on a semiconductor substrate.
Figure 3A:
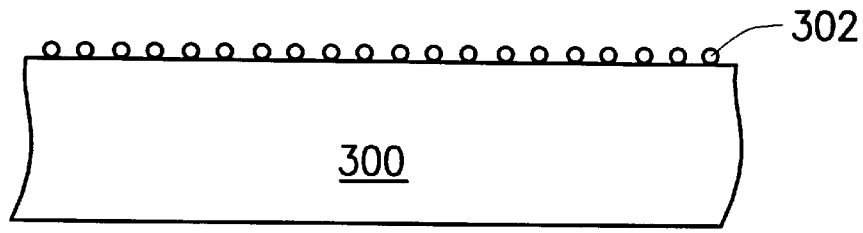
FIG. 3A to FIG. 3D show the process of the method shown in FIG. 2.
Figure 3B:
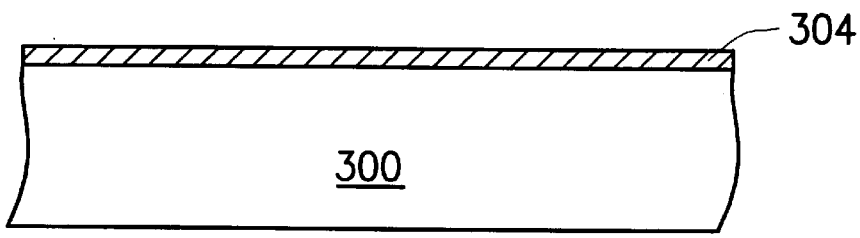
Figure 3C:
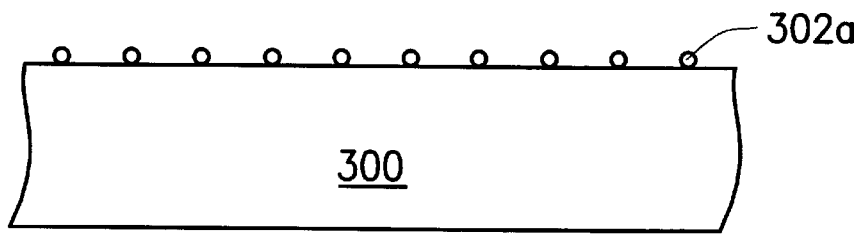
Figure 3D:
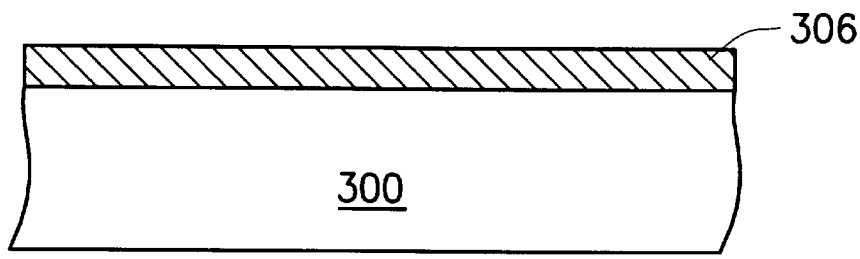
Figure 5D:
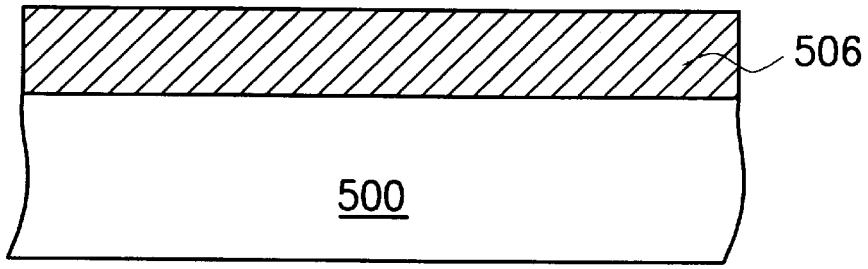

In FIG. 5D, a gate oxide layer 506 is formed on the substrate 500 over the surface that is now free, or at least mere free of carbon contamination. It is known that the carbon contamination inhibits the growth of oxide. In the conventional method, the thickness of the oxide layer cannot be controlled as required due to the inevitable residue of carbon contamination. In the invention, substantially all of the carbon contamination can be removed, and thus the gate oxide layer 506 can be formed as thick as required. In this example, a gate oxide layer 506 is formed thicker than the oxide layer 306 of the conventional method shown in FIG. 3D.

Figure 6A:
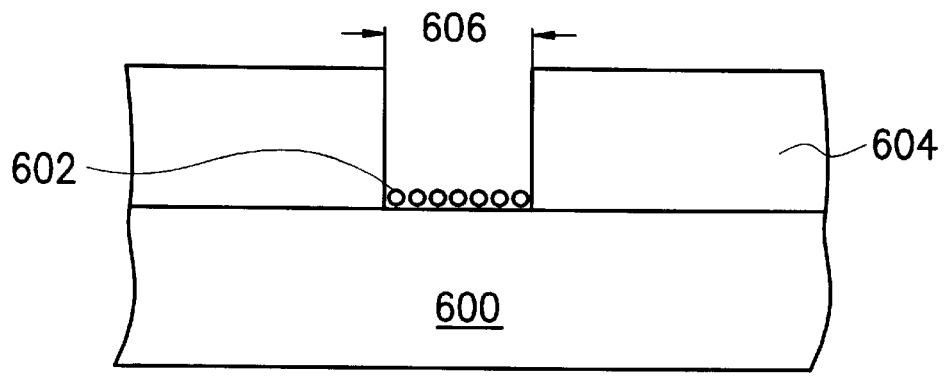
FIG. 6A to FIG. 6C are cross sectional views of an alternate embodiment of removing carbon contamination on a bottom surface of a contact window.
Figure 6B:
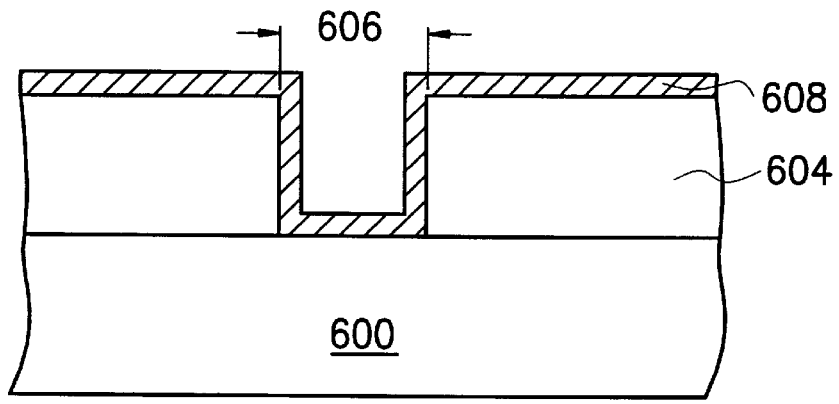
Figure 6C:
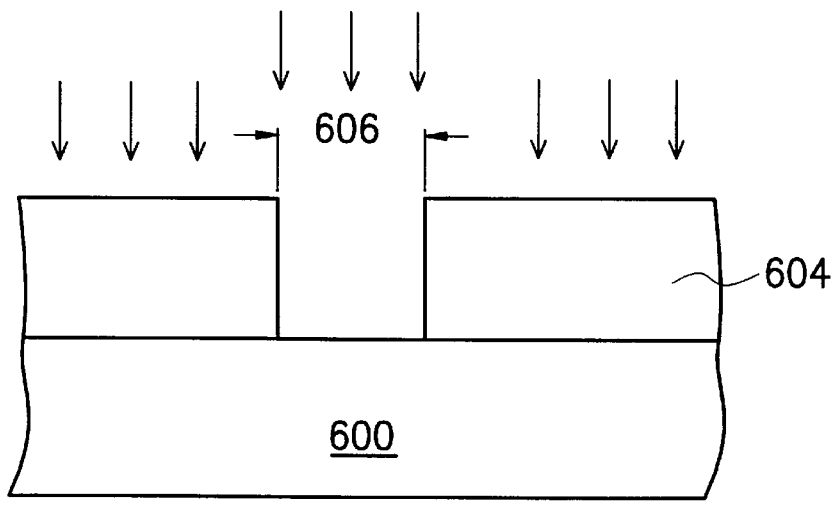

Another example of removing carbon contamination is shown as FIG. 6A to FIG. 6C. In FIG. 6A, a semiconductor substrate 600 having a dielectric layer 604 and a contact window 606 which exposes a part of the semiconductor substrate 600 is provided. While forming the contact 606 or after other previous process, a quantity of carbon contamination 602 is produced and left on a bottom surface of the contact window 606.

In FIG. 6B, during the formation of a sacrificial oxide layer 608, trans-dichloroethylene is introduced. The sacrificial oxide layer 608 is formed, for example, under a high temperature by thermal oxidation. As mentioned above, with the introduction of trans-dichloroethylene, controlled amounts of the carbon contamination 602 are trapped by the sacrificial oxide layer 608, and preferably substantially all of the carbon contamination 602 is trapped.

In FIG. 6C, the sacrificial oxide layer 608 is removed by typical processes, for example, by using diluted hydrogen flouride as an etchant. Meanwhile, since most, and preferably substantially all of the carbon contamination 602 is trapped by the sacrificial oxide layer 608, the carbon contamination 602 is removed with the sacrificial oxide layer 608.

In the above embodiments according to the invention, with the introduction of an agent, for example, trans-dichloroethylene, carbon contamination is removed effectively with the sacrificial oxide layer. Since the carbon contamination is removed effectively, a gate oxide layer formed subsequently is not affected by the carbon contamination. A good quality and a required thickness of the gate oxide layer can be obtained. In the second embodiment, any other deposition layer formed on the substrate subsequently is not affected by the carbon contamination as the carbon contamination can be removed.

In addition to the above-mentioned embodiments, the invention can also be applied as a process, for using with a semiconductor substrate containing carbon contamination on an exposed surface area of the semiconductor substrate. An oxide layer is formed on the exposed surface area. During at least a portion of the forming step, trans-dichloroethylene is introduced.

In addition, the carbon contamination is removed effectively without a long etching time, thus avoiding harm to other structure on the substrate and increasing the device yields.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of removing carbon contamination from an exposed surface of a semiconductor substrate, comprising the steps of:

forming a sacrificial oxide layer on the substrate simultaneously with the introduction of an agent which enables substantially all of the carbon contamination to be trapped with the sacrificial oxide layer and which improves growth of the sacrificial oxide layer; and removing the sacrificial oxide layer.

2. The method according to claim 1, comprising the step of forming the sacrificial oxide layer by thermal oxidation.

3. The method of claim 1, wherein hydrogen fluoride is used in the step of removing the sacrificial oxide layer.

4. The method of claim 1, wherein the agent comprises trans-dichloroethylene.

5. A method of removing carbon contamination on an exposed surface of a semiconductor substrate, comprising:

forming an oxide layer on the substrate in the presence of trans-dichloroethylene; and removing the oxide layer.

6. The method of claim 5, comprising using thermal oxidation for the step of forming the oxide layer.

7. A method of forming a gate oxide on a semiconductor substrate, comprising:

forming a sacrificial oxide layer in the presence of an agent which enables the sacrificial oxide layer to trap substantially all of the carbon contamination and improves growth of the sacrificial oxide layer;

removing the sacrificial oxide layer; and forming a gate oxide layer on the semiconductor substrate, wherein the agent includes trans-dichloroethylene.

8. The method according to claim 7, comprising the step of removing the sacrificial oxide layer with diluted hydrogen fluoride as an etchant.

9. The method according to claim 7, comprising the step of forming the gate oxide layer by thermal oxidation.

10. A process, for use with a semiconductor substrate containing carbon contamination on an exposed surface area of the semiconductor substrate, comprising the steps of:

forming an oxide layer on the exposed surface area; and introducing trans-dichloroethylene during at least a portion of the forming step.

11. The method according to claim 10, comprising the further steps of removing the oxide layer.

12. The method according to claim 11, wherein the removing step comprises the step of removing the oxide layer with hydrogen fluoride.

13. The method according to claim 10, comprising the further steps of forming a gate oxide layer on the area of the substrate.

14. A process, comprising the steps of:

performing a plasma etch on a surface area of a semiconductor substrate and leaving carbon contamination on the area;

forming an oxide layer over the area; and introducing trans-dichloroethylene during at least a portion of the forming step.

15. The method according to claim 14, comprising the further step of removing the oxide layer.

16. The method according to claim 15, wherein the oxide layer is removed by hydrogen fluoride.

* * * * *